(12) United States Patent
Mitsuboshi et al.

(10) Patent No.: US 11,643,577 B2
(45) Date of Patent: May 9, 2023

(54) ADHESIVE, ELECTRONIC APPARATUS, AND OPTICAL APPARATUS

(71) Applicant: SONY CORPORATION, Tokyo (JP)

(72) Inventors: Masahiko Mitsuboshi, Aichi (JP); Motohisa Inadu, Shizuoka (JP)

(73) Assignee: SONY CORPORATION, Tokyo (JP)

( * ) Notice: Subject to any disclaimer, the term of this patent is extended or adjusted under 35 U.S.C. 154(b) by 478 days.

(21) Appl. No.: 16/635,742

(22) PCT Filed: Jul. 20, 2018

(86) PCT No.: PCT/JP2018/027214
§ 371 (c)(1),
(2) Date: Jan. 31, 2020

(87) PCT Pub. No.: WO2019/031194
PCT Pub. Date: Feb. 14, 2019

(65) Prior Publication Data
US 2021/0122949 A1    Apr. 29, 2021

(30) Foreign Application Priority Data

Aug. 8, 2017   (JP) .............................. JP2017-153191

(51) Int. Cl.
*C09J 11/08*     (2006.01)
*C08K 3/36*     (2006.01)
(Continued)

(52) U.S. Cl.
CPC ................. *C09J 11/08* (2013.01); *C08K 3/36* (2013.01); *C08K 9/10* (2013.01); *C09J 11/04* (2013.01);
(Continued)

(58) Field of Classification Search
CPC ...... C09J 11/08; C09J 11/04; C09J 2203/326; C09J 2301/124; C09J 2301/302; C08K 3/36; C08K 9/10
See application file for complete search history.

(56) References Cited

U.S. PATENT DOCUMENTS 6,264,775 B1 *   7/2001   Holeschovsky ..... D06N 7/0086
                                                156/331.7
2005/0037189 A1   2/2005   Palmer et al.
(Continued)

FOREIGN PATENT DOCUMENTS

CN       105623581      6/2016
JP       H07-062141     3/1995
(Continued)

OTHER PUBLICATIONS

International Search Report prepared by the Japan Patent Office on Sep. 18, 2018, for International Application No. PCT/JP2018/027214.
(Continued)

*Primary Examiner* — Scott R. Walshon
(74) *Attorney, Agent, or Firm* — Sheridan Ross P.C.

(57) ABSTRACT

To provide an adhesive suitable to bond a component of an electronic apparatus or an optical apparatus, as well as an electronic apparatus and an optical apparatus in which the adhesive is used. An adhesive according to an embodiment of the present technology includes a flexible adhesive material and a plurality of particles. The adhesive material is flexible. The plurality of particles is dispersed in the adhesive material, the plurality of particles being deformed under a low-rate load and not being deformed under a high-rate load.

12 Claims, 6 Drawing Sheets

(51) Int. Cl.
*C08K 9/10* (2006.01)
*C09J 11/04* (2006.01)

(52) U.S. Cl.
CPC .... *C09J 2203/326* (2013.01); *C09J 2301/124* (2020.08); *C09J 2301/302* (2020.08); *C09J 2483/00* (2013.01)

(56) References Cited

U.S. PATENT DOCUMENTS

| | | | |
|---|---|---|---|
| 2007/0029690 A1 | 2/2007 | Green et al. | |
| 2010/0147566 A1* | 6/2010 | Sato | H05K 1/036 174/258 |
| 2011/0283433 A1* | 11/2011 | Holt | C09J 7/205 2/22 |
| 2015/0153594 A1 | 6/2015 | Sato | |
| 2015/0375474 A1 | 12/2015 | Degolier et al. | |
| 2016/0032166 A1* | 2/2016 | Zhang | C09J 11/04 252/75 |

FOREIGN PATENT DOCUMENTS

| | | | |
|---|---|---|---|
| JP | 2005-513248 | 5/2005 | |
| JP | 2007-516303 | 6/2007 | |
| JP | 2010-024420 | 2/2010 | |
| JP | 2012-238771 | 12/2012 | |
| JP | 2014-044984 | 3/2014 | |
| JP | 2015513248 A | 4/2015 | |
| JP | 2016-513186 | 5/2016 | |
| JP | 2017-130403 | 7/2017 | |
| WO | WO-2007100312 A2 * | 9/2007 | ............... B32B 5/02 |
| WO | WO 2013/183597 | 12/2013 | |

OTHER PUBLICATIONS

Official Action (no English translation available) for Chinese Patent Application No. 201880050065.3, dated Nov. 18, 2020, 65 pages.

* cited by examiner (a)

(b)

ADHESIVE, ELECTRONIC APPARATUS, AND OPTICAL APPARATUS

CROSS REFERENCE TO RELATED APPLICATIONS

This application is a national stage application under 35 U.S.C. 371 and claims the benefit of PCT Application No. PCT/JP2018/027214 having an international filing date of 20 Jul. 2018, which designated the United States, which PCT application claimed the benefit of Japanese Patent Application No. 2017-153191 filed 8 Aug. 2017, the entire disclosures of each of which are incorporated herein by reference.

TECHNICAL FIELD

The present technology relates to an adhesive used to bond a component of an electronic apparatus or an optical apparatus, as well as an electronic apparatus and an optical apparatus in which the adhesive is used.

BACKGROUND ART

In various apparatuses such as an electronic apparatus and an optical apparatus, a component is often fixed by performing bonding, and there may be a need to perform firm bonding or flexible bonding depending on the application or a bonding-target portion. Further, there may also be a need to perform both the firm bonding and the flexible bonding.

For example, when an optical component is bonded, there is a need to perform flexible bonding at normal times in order to prevent a distortion from occurring in the optical component. However, there is a need to perform firm bonding that makes it possible to fix the position of the optical component in certainty when an apparatus experiences an impact due to, for example, being dropped.

Further, in a waterproof electronic apparatus, there is a need to perform flexible bonding at normal times in order to ensure waterproofness. However, there is a need to perform firm bonding when the apparatus experiences an impact due to, for example, being dropped, in order to prevent a component from being deformed or broken.

A dilatancy material in which particles are contained in liquid is known as a material exhibiting a property variable depending on a loading rate. The dilatancy (shear thickening) is a property of behaving like a liquid under a low-rate load and behaving like a solid under a high-rate load (for example, refer to Patent Literatures 1 to 3).

CITATION LIST

Patent Literature

Patent Literature 1: Japanese Patent Application Laid-open No. 2012-238771
Patent Literature 2: Japanese Patent Application Laid-open No. 7-62141
Patent Literature 3: Japanese Patent Application Laid-open No. 2010-24420

DISCLOSURE OF INVENTION

Technical Problem

However, it is not possible to use the dilatancy materials disclosed in Patent Literatures 1 to 3 to perform bonding, although the materials exhibit a dilatancy in a liquid state.

In view of the circumstances described above, it is an object of the present technology to provide an adhesive suitable to bond a component of an electronic apparatus or an optical apparatus, as well as an electronic apparatus and an optical apparatus in which the adhesive is used.

Solution to Problem

In order to achieve the object described above, an adhesive according to an embodiment of the present technology includes a flexible adhesive material and a plurality of particles.

The adhesive material is flexible.

The plurality of particles is dispersed in the adhesive material, the plurality of particles being deformed under a low-rate load and not being deformed under a high-rate load.

According to this feature, the plurality of particles is dispersed in the flexible adhesive material, the plurality of particles exhibiting a property (a dilatant property) of being deformed under the low-rate load, and of not being deformed under the high-rate load. This results in the flexibility of the adhesive varying according to a rate of a load applied on the adhesive, and thus in the adhesive serving as a dilatancy adhesive.

The adhesive material and the plurality of particles may be deformed under the low-rate load, and, under the high-rate load, the adhesive material may be deformed, and particles of the plurality of particles may be situated close to one another without being deformed.

According to this feature, the adhesive material and the plurality of particles are both deformed when the adhesive is subjected to the low-rate load, and this results in the adhesive having a great flexibility. On the other hand, when the adhesive is subjected to the high-rate load, the particles of the plurality of particles are situated close to one another without being deformed, and this results in the adhesive having a great stiffness.

Each of the plurality of particles may include a flexible outer shell, fluid contained in the outer shell, and a plurality of hard particles dispersed in the fluid.

According to this feature, a dilatant property is provided due to the fluid and the hard particle, and it is possible to obtain the particle exhibiting a dilatant property by the fluid and the hard particle being contained in the outer shell.

The fluid may be silicone oil, and each of the plurality of hard particles may be a silica particle.

Each of the plurality of particles may include synthetic resin formed into a particle.

It is also possible to obtain the particle exhibiting a dilatant property by forming synthetic resin into a particle.

In order to achieve the object described above, an electronic apparatus according to an embodiment of the present technology includes an adhesive and an electronic component.

The adhesive includes a flexible adhesive material, and a plurality of particles dispersed in the adhesive material, the plurality of particles being deformed under a low-rate load and not being deformed under a high-rate load.

The electronic component is bonded with the adhesive.

This feature makes it possible to seal a portion between electronic components in certainty in normal times due to the flexibility of the adhesive, and to ensure waterproofness. Further, when the electronic apparatus experiences an impact due to, for example, being dropped, it is possible to prevent the electronic component from being deformed or broken since the electronic component is fixed firmly.

In order to achieve the object described above, an optical apparatus according to an embodiment of the present technology includes an adhesive and an optical component.

The adhesive includes a flexible adhesive material, and a plurality of particles dispersed in the adhesive material, the plurality of particles being deformed under a low-rate load and not being deformed under a high-rate load.

The optical component is bonded with the adhesive.

This feature makes it possible to prevent, due to the flexibility of the adhesive, an optical distortion from occurring in the optical component in normal times. Further, when the optical apparatus experiences an impact due to, for example, being dropped, it is possible to prevent the position of the optical component from being shifted and to prevent the optical component from being broken, since the optical component is fixed firmly.

In order to achieve the object described above, an adhesive according to an embodiment of the present technology includes an adhesive material and a plurality of particles. The adhesive material is deformed under a load. The plurality of particles is dispersed in the adhesive material, the plurality of particles being deformed under a load with a loading rate that is not greater than a first loading rate, the plurality of particles not being deformed under a load with a loading rate that is greater than the first loading rate and not less than a second loading rate.

Advantageous Effects of Invention

As described above, the present technology makes it possible to provide an adhesive suitable to bond a component of an electronic apparatus or an optical apparatus, as well as an electronic apparatus and an optical apparatus in which the adhesive is used. Note that the effect described here is not necessarily limitative and may be any effect described in the present disclosure.

MODE(S) FOR CARRYING OUT THE INVENTION

Figure 1:
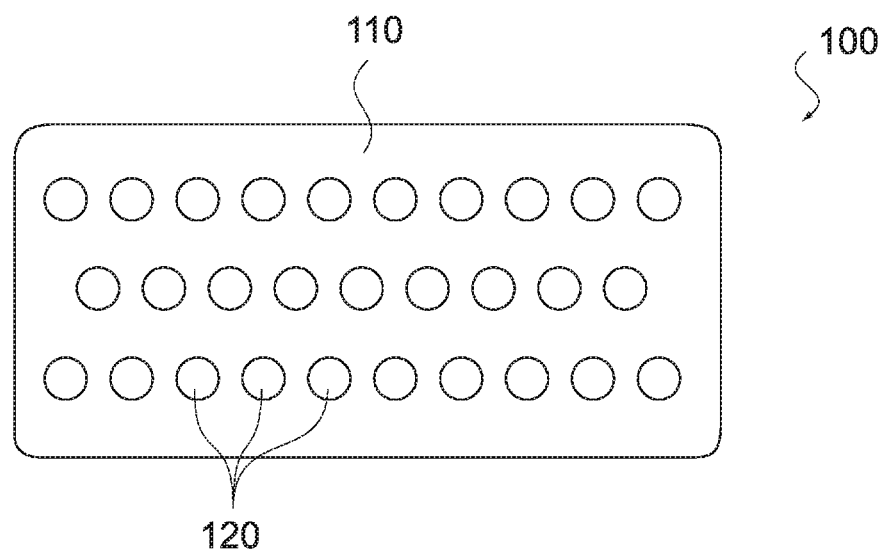
FIG. 1 schematically illustrates a structure of an adhesive according to an embodiment of the present technology.

An adhesive according to an embodiment of the present technology is described. FIG. 1 schematically illustrates a structure of an adhesive 100 according to the present embodiment.

As illustrated in the figure, the adhesive 100 includes an adhesive material 110 and dilatant particles 120.

[Regarding Adhesive Material]

The adhesive material 110 is flexible, and is deformed under a load. It is desirable that the adhesive material 110 be fluid when the adhesive material 110 is applied to a bonding-target component, and be flexible after bonding is performed. The composition of the adhesive material 110 is not particularly limited, and it is sufficient if the adhesive material 110 is flexible. Specifically, it is desirable that the hardened adhesive material 110 have a Young's modulus of 100 MPa or less.

[Regarding Dilatant Particle]

Figure 2:
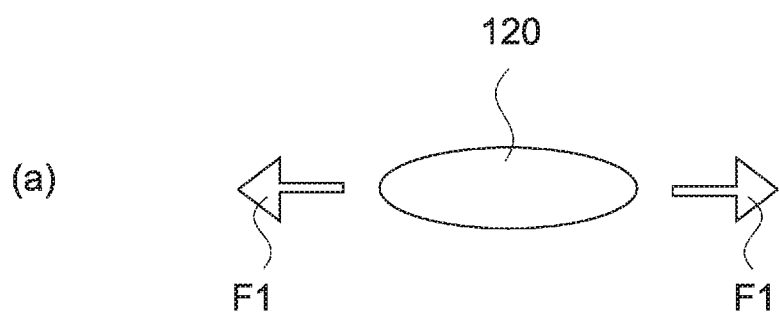
FIG. 2 schematically illustrates a change in a state of a dilatant particle included in the adhesive.
Figure 2:
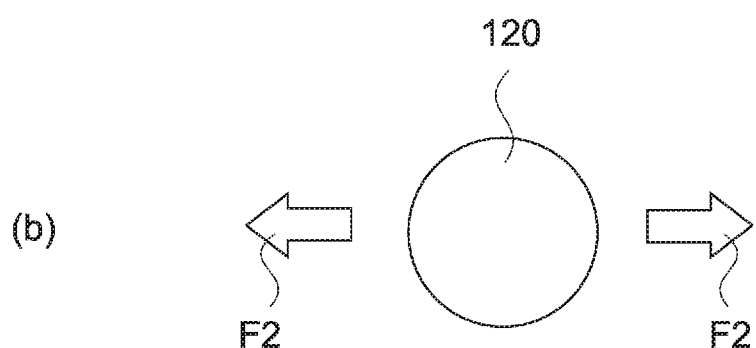

As illustrated in FIG. 1, the dilatant particles 120 are dispersed in the adhesive material 110. The dilatant particle 120 is a particle that exhibits a dilatant property. FIG. 2 schematically illustrates the dilatant particle 120. The dilatant particle 120 exhibits a property (the dilatant property) of being deformed depending on a low-rate load when the dilatant particle 120 is subjected to the low-rate load (F1 in the figure), as illustrated in (a) of FIG. 2, and of not being deformed when the dilatant particle 120 is subjected to a high-rate load (F2 in the figure), as illustrated in (b) of FIG. 2. Note that the low-rate load is a load with a loading rate of 9.8 m/s$^2$ or less, and the high-rate load is a load with a loading rate of 49 m/s$^2$ or more.

The dilatant particle 120 may be a capsule exhibiting the dilatant property or a particle exhibiting the dilatant property.

<Regarding Capsule>

Figure 3:
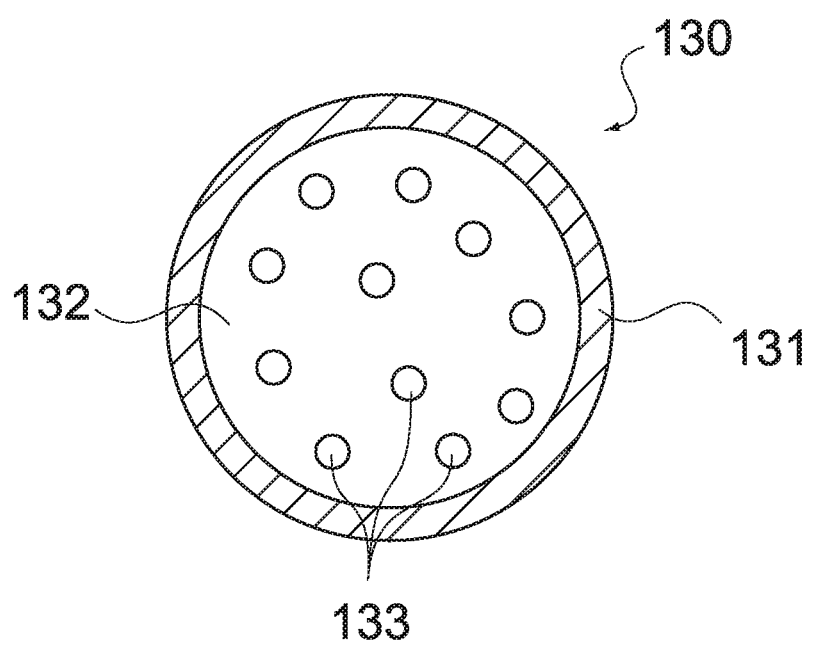
FIG. 3 schematically illustrates a structure of the dilatant particle included in the adhesive.

FIG. 3 is a cross-sectional view of a capsule 130 that can be used as the dilatant particle 120. As illustrated in the figure, the capsule 130 includes an outer shell 131, fluid 132, and hard particles 133.

The outer shell 131 includes a flexible material. The material and the thickness of the outer shell 131 are not particularly limited, and it is sufficient if the outer shell 131 is flexible. Specifically, it is desirable that the outer shell 131 have a Young's modulus of 100 MPa or less.

The fluid 132 is contained in the outer shell 131. The kinetic viscosity of the fluid 132 is desirably not less than 10 mm$^2$/s and not greater than 150 mm$^2$/s at a room temperature of 25° C., and more desirably, not less than 30 mm$^2$/s and not greater than 100 mm$^2$/s at a room temperature of 25° C. Note that the kinetic viscosity described above is a value measured using an Ubbelohde viscometer per ASTM D445-46T.

It is desirable that the material of the fluid 132 be a material that does not occur, for example, thermal decomposition or decay, and the material of the fluid 132 may be, for example, silicone oil. For example, KF-96L-30 (Shin-Etsu Silicone) or KF-96L-100 (Shin-Etsu Silicone) may be used as the silicone oil.

The hard particles 133 are dispersed in the fluid 132, and are hard particles that are not deformed under a load. Regarding the size of the hard particle 133, the diameter of the hard particle 133 is desirably not less than 1 nm and not greater than 30 μm, and more desirably, not less than 500 nm and not greater than 2.5 μm. Table 1 shows a result of an experiment regarding an optimal particle diameter of a silica particle that can be used as the hard particle 133, where ○ represents the case of exhibiting the dilatant property, and X represents the case of not exhibiting the dilatant property.

TABLE 1

| Kinetic viscosity of oil | | | Silica particle (fixed at 7 g) | | | | |
|---|---|---|---|---|---|---|---|
| | | | 0.1 | 0.3 | 0.5 | 1.0 | 2.5 |
| | Proportion | Mass | μm | μm | μm | μm | μm |
| 30100 mm/s ※ Blending proportion of oil when silica particle is 100 parts by mass | 22 | 1.54 | X | X | X | X | X |
| | 25 | 1.75 | X | X | X | X | X |
| | 28 | 1.96 | X | X | X | X | ○ |
| | 31 | 2.17 | X | X | X | X | ○ |
| | 34 | 2.38 | X | X | X | ○ | ○ |
| | 37 | 2.59 | X | X | ○ | ○ | ○ |
| | 37.5 | 2.62 | X | X | ○ | ○ | ○ |
| | 38 | 2.66 | X | X | ○ | ○ | X |
| | 38.5 | 2.70 | X | X | ○ | ○ | X |
| | 39 | 2.74 | X | X | ○ | X | X |
| | 40 | 2.82 | X | X | X | X | X |
| | 41 | 2.90 | X | X | X | X | X |
| | 42 | 2.98 | X | X | X | X | X |

The hard particle 133 may be, for example, a silica particle. For example, KE-P50 (NIPPON SHOKUBAI CO., LTD.), KE-P100 (NIPPON SHOKUBAI CO., LTD.), KE-P250 (NIPPON SHOKUBAI CO., LTD.), KE-S50 (NIPPON SHOKUBAI CO., LTD.), KE-S100 (NIPPON SHOKUBAI CO., LTD.), and KE-S250 (NIPPON SHOKUBAI CO., LTD.) may be used as the silica particle. Note that there exists a hydrophilic treatment or a hydrophobic treatment as a method for treating the surface of a silica particle in order to develop a dilatant property, but there is not a great difference between these treatments.

Figure 8:
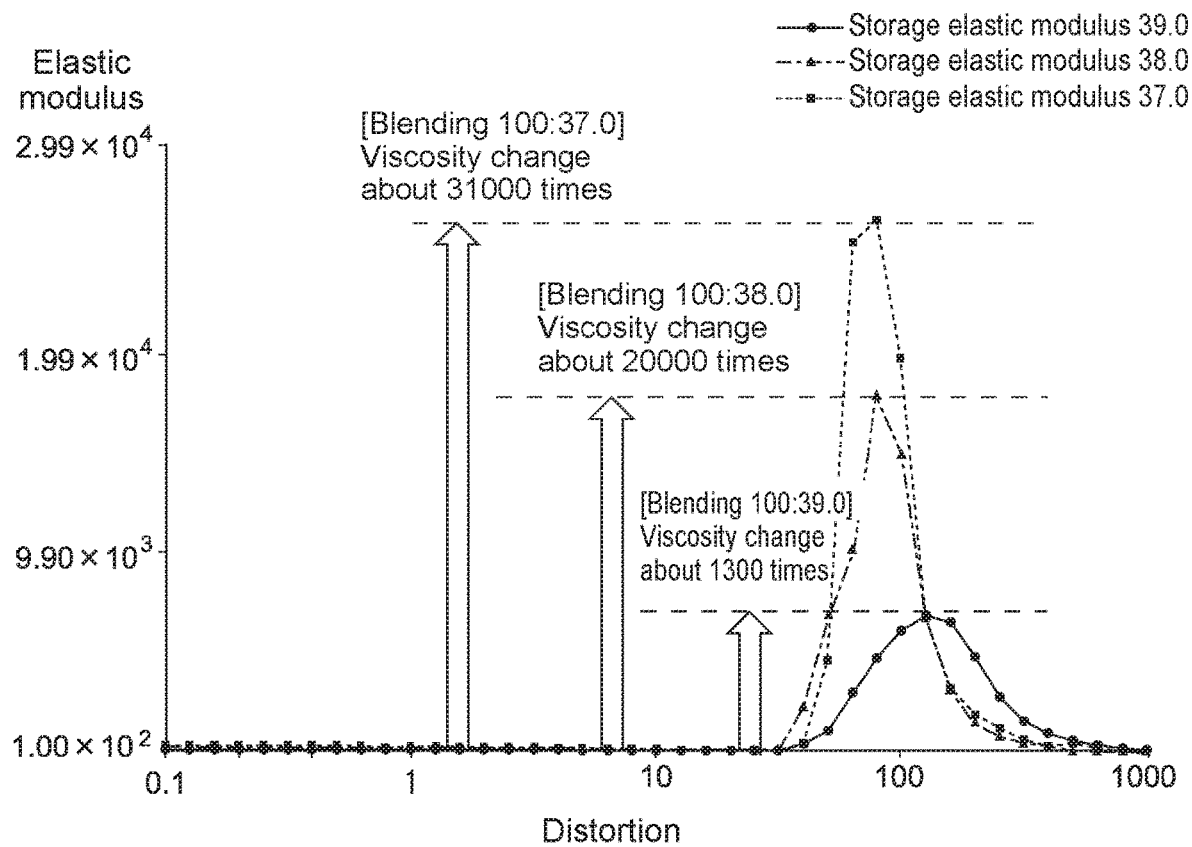
FIG. 8 is a graph showing a result of measuring the adhesive in an optimal blending proportion using a rheometer.

Regarding the blending amount of the hard particle 133 and the fluid 132, it is desirable that, when the hard particle 133 is a silica particle and the fluid 132 is silicone oil, silicone oil be in an amount that is not less than 22 parts by mass and not greater than 60 parts by mass with respect to 100 parts by mass of silica particle, since this results in exhibiting a dilatant property. It is more desirable that, for example, when the particle diameter is 500 nm, silicone oil be in an amount that is not less than 37 parts by mass and not greater than 39 parts by mass with respect to 100 parts by mass of silica particle, since this results in significantly exhibiting a dilatant property. FIG. 8 illustrates a result of measurement performed in an optimal blending proportion using a rheometer.

<Regarding Particle>

Figure 4:
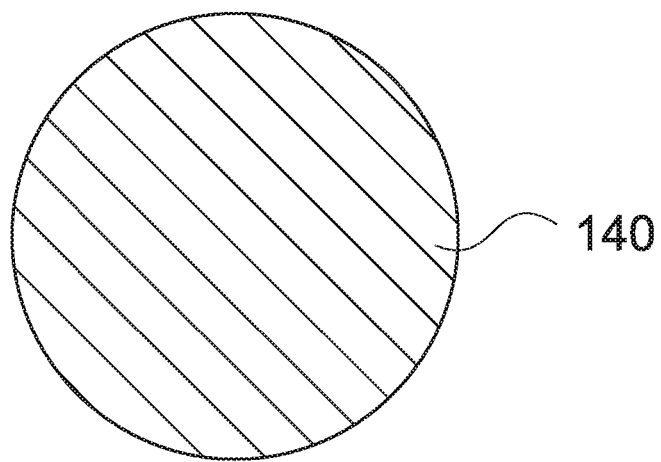
FIG. 4 schematically illustrates a structure of the dilatant particle included in the adhesive.

FIG. 4 is a cross-sectional view of a particle 140 that can be used as the dilatant particle 120. As illustrated in the figure, the particle 140 is a particle including a specific material, and is, for example, synthetic resin formed into a particle. The material of the particle 140 is not particularly limited, and it is sufficient if the particle 140 exhibits a dilatant property.

Further, the application to D30 using 3179 Dilatant Compound (Dow Corning Toray Co., Ltd.) as the particle 140 may be acceptable.

The dilatant particle 120 may be the capsule 130 or the particle 140 described above, or may be both the capsule 130 and the particle 140. The particle size of the dilatant particle 120 and the blending proportion of the dilatant particle 120 to the adhesive material 110 are not particularly limited, and can be adjusted in a range in which the adhesive 100 exhibits a dilatancy described later.

[Action of Adhesive]

Figure 5:
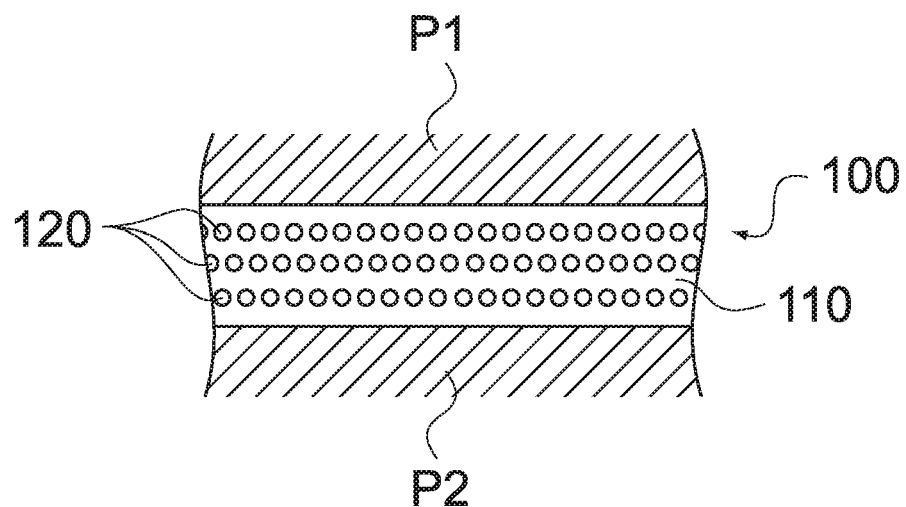
FIG. 5 schematically illustrates a state of bonding components using the adhesive.

An action of the adhesive 100 is described. FIG. 5 schematically illustrates a state of bonding performed using the adhesive 100, and an example in which a component P1 and a component P2 are bonded to each other with the adhesive 100, is described. For example, an equivalent effect can be provided in a state of bonding the two components as illustrated in FIG. 5, or in a state of bonding more than two components. As illustrated in the figure, the component P1 and the component P2 are in contact with the adhesive material 110, and bonded to each other due to an adhesive power of the adhesive material 110. The dilatant particles 120 are separated from one another.

Figure 6:
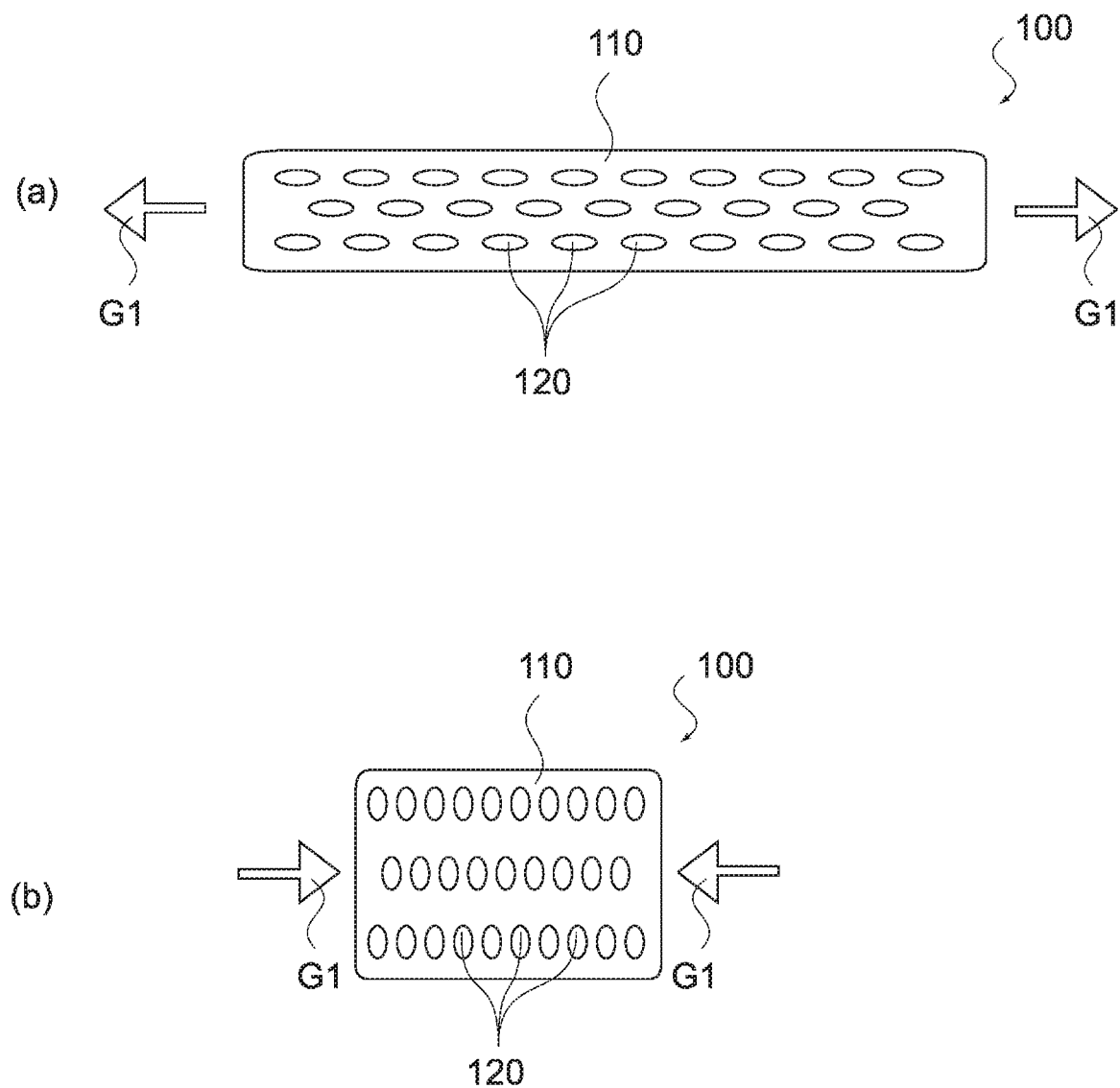
FIG. 6 schematically illustrates a state of the adhesive when the adhesive is subjected to a low-rate load.

FIG. 6 schematically illustrates a state of the adhesive 100 when the adhesive 100 is subjected to a low-rate load. When a low-rate load (G1 in the figure) is applied in a direction of stretching the adhesive 100, as illustrated in (a) of FIG. 6, or when the low-rate load (G1 in the figure) is applied in a direction of compressing the adhesive 100, as illustrated in (b) of FIG. 6, both the adhesive material 110 and the dilatant particles 120 are deformed according to the low-rate load.

This enables the component P1 and the component P2 to move, in a state of being bonded to each other, in a certain range according to the load. When the load is no longer applied, the deformation of the adhesive material 110 and the dilatant particles 120 is overcome, as illustrated in FIG. 1, and the adhesive 100 returns to its original state.

Figure 7:
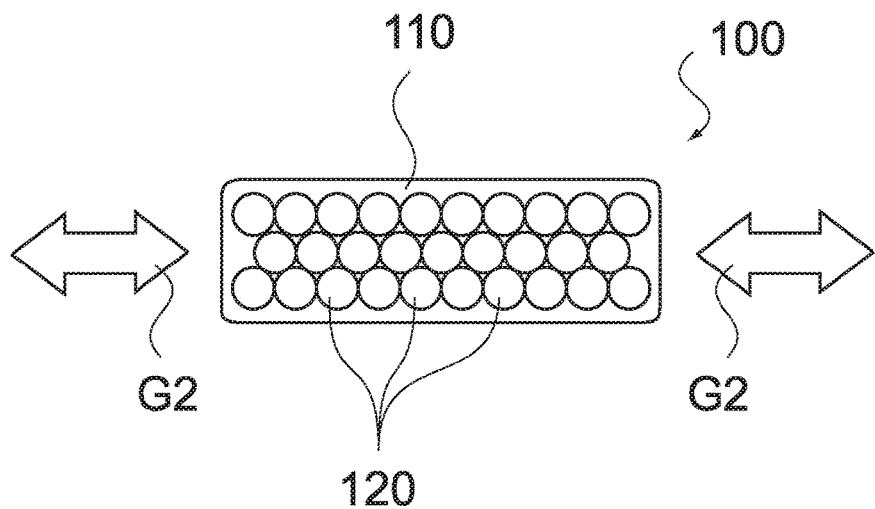
FIG. 7 schematically illustrates a state of the adhesive when the adhesive is subjected to a high-rate load.

FIG. 7 schematically illustrates a state of the adhesive 100 when the adhesive 100 is subjected to a high-rate load. When a high-rate load (G2 in the figure) is applied in a direction of stretching or compressing the adhesive 100 as illustrated in the figure, the adhesive material 110 is deformed according to the high-rate load. On the other hand, the dilatant particles 120 are not deformed under the high-rate load, as described above, and the dilatant particles 120 are situated close to one another and the positions of the dilatant particles 120 are fixed, as illustrated in FIG. 7. Note that the state of the dilatant particles 120 being situated close to one another refers to a state in which the dilatant particles 120 are in contact with one another, or the dilatant particles are situated closer to one another than when blending is performed.

This results in fixing the respective positions of the component P1 and the component P2, and in firmly bonding the component P1 and the component P2 to each other with a great stiffness. When the load is no longer applied, the deformation of the adhesive material 110 is overcome, as illustrated in FIG. 1, and the adhesive 100 returns to its original state.

As described above, the adhesive 100 is deformed according to a low-rate load when the adhesive 100 is subjected to the low-rate load, and the adhesive 100 can maintain firm bonding when the adhesive 100 is subjected to a high-rate load. Thus, the adhesive 100 serves as a dilatancy adhesive having a flexibility that varies according to a loading rate.

[Examples of Application]

The adhesive 100 according to the present embodiment can be used to bond an optical component in an optical apparatus such as a camera and a projector.

In general, if an adhesive used to bond an optical component is hard, an optical distortion may occur in the optical component at the ordinary temperature or a low temperature. On the other hand, if an adhesive used to bond an optical component is soft, the position of the optical component may be shifted or the optical component may be broken when an optical apparatus experiences an impact due to, for example, being dropped.

Here, it is possible to suppress the occurrence of an optical distortion by bonding an optical component with the adhesive 100, since the adhesive 100 is flexible at the ordinary temperature or a low temperature. Further, it is possible to improve a withstanding performance since there is an increase in the stiffness of the adhesive 100 when an optical apparatus experiences an impact.

Furthermore, the adhesive 100 according to the present embodiment can be used to bond a waterproof bonding portion, such as a portion between electronic components in an electronic apparatus such as a smartphone or a portable music apparatus, the waterproof bonding portion being a portion for which waterproofness is particularly necessary.

When an adhesive used for a waterproof bonding portion is hard, a water leak may occur. On the other hand, when an adhesive used for a waterproof bonding portion is soft, the position of the optical component may be shifted or the optical component may be broken when an optical apparatus experiences an impact due to, for example, being dropped.

Here, it is possible to ensure waterproofness by bonding a waterproof bonding portion with the adhesive 100, since the adhesive 100 is flexible at the ordinary temperature or a low temperature. Further, it is possible to improve a withstanding performance since there is an increase in the stiffness of the adhesive 100 when an optical apparatus experiences an impact.

Further, the application of the adhesive 100 may be a protector application other than the application of fixation of a component. For example, it is possible to provide a function that prevents a breakage due to dropping, by applying the adhesive 100 to a corner or an edge of a housing of, for example, a replacement lens for a camera, a digital video camera, and a drone. Furthermore, the adhesive 100 may be applied to protect a component included in the housing. It is also possible to provide a function that prevents a breakage due to dropping, by applying the adhesive 100 to, for example, a portion around a battery in a smartphone, or a portion around a hard disk or a memory in a personal computer.

Figure 9:
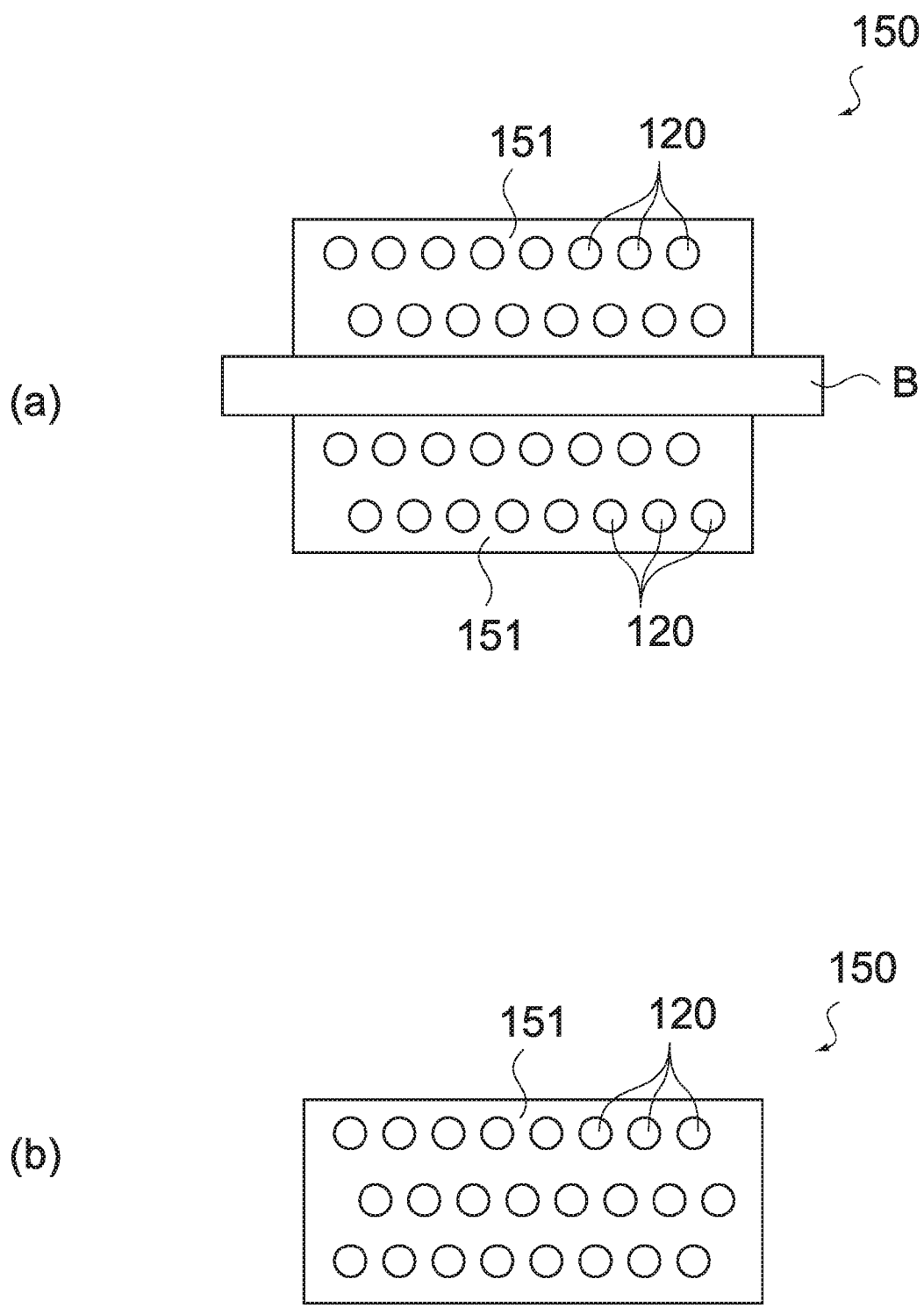
FIG. 9 schematically illustrates a configuration of a double-sided tape according to an embodiment of the present technology.

The present technology is not necessarily limited to the adhesive, and it may be a pressure-sensitive adhesive (a double-sided tape). FIG. 9 schematically illustrates a pressure-sensitive adhesive 150. As illustrated in (a) of FIG. 9, the double-sided tape 150 includes pressure-sensitive adhesive materials 151 that are stacked on both front and back faces of a base material B, in which the dilatant particles 120 are dispersed in the pressure-sensitive adhesive material 151. The pressure-sensitive adhesive material 151 has a configuration identical to the configuration of the adhesive material 110.

Further, as illustrated in (b) of FIG. 9, the double-sided tape 150 may only include, without including a base material, the pressure-sensitive adhesive material 151 in which the dilatant particles 120 are dispersed. Note that the particle size of the dilatant particle 120 and the blending proportion of the dilatant particle 120 to the pressure-sensitive adhesive material 151 are not particularly limited, and can be adjusted in a range in which the double-sided tape 150 exhibits a dilatancy, as in the case of the adhesive 100.

As described above, the adhesive 100 makes it possible to provide two different properties (trade-off properties) of suppressing a distortion and withstanding an impact, or of being waterproof and withstanding an impact. Further, there is additionally no need to supplement the functionality with a plurality of components, and this results in being able to, for example, save space and reduce production costs.

Note that the present technology may also take the following configurations.

(1) An adhesive including:
a flexible adhesive material; and
a plurality of particles dispersed in the adhesive material, the plurality of particles being deformed under a low-rate load and not being deformed under a high-rate load.
(2) The adhesive according to (1), in which
the adhesive material and the plurality of particles are deformed under the low-rate load, and
under the high-rate load, the adhesive material is deformed, and particles of the plurality of particles are situated close to one another without being deformed.
(3) The adhesive according to (1) or (2), in which
each of the plurality of particles includes a flexible outer shell, fluid contained in the outer shell, and a plurality of hard particles dispersed in the fluid.
(4) The adhesive according to (3), in which
the fluid is silicone oil, and
each of the plurality of hard particles is a silica particle.
(5) The adhesive according to (1) or (2), in which
each of the plurality of particles includes synthetic resin formed into a particle.
(6) An electronic apparatus including:
an adhesive that includes
a flexible adhesive material, and
a plurality of particles dispersed in the adhesive material, the plurality of particles being deformed under a low-rate load and not being deformed under a high-rate load; and
an electronic component bonded with the adhesive.
(7) An optical apparatus including:
an adhesive that includes
a flexible adhesive material, and
a plurality of particles dispersed in the adhesive material, the plurality of particles being deformed under a low-rate load and not being deformed under a high-rate load; and
an optical component bonded with the adhesive.
(8) An adhesive including:
an adhesive material that is deformed under a load; and
a plurality of particles dispersed in the adhesive material, the plurality of particles being deformed under a load with a loading rate that is not greater than a first loading rate, the plurality of particles not being deformed under a load with a loading rate that is greater than the first loading rate and not less than a second loading rate.

100 adhesive
110 adhesive material
120 dilatant particle
130 capsule
131 outer shell
132 fluid
133 hard particle
140 particle
150 pressure-sensitive adhesive (double-sided tape: with base material/without base material)
151 pressure-sensitive adhesive material

What is claimed is:
1. An adhesive, comprising:
a flexible adhesive material; and
a plurality of particles dispersed in the adhesive material, the plurality of particles being deformed under a low-rate load and not being deformed under a high-rate load,
wherein the adhesive material and the plurality of particles are deformed under the low-rate load,
wherein, under the high-rate load, the adhesive material is deformed, and particles of the plurality of particles are situated close to one another without being deformed, wherein each of the plurality of particles includes a flexible outer shell, fluid contained in the outer shell, and a plurality of hard particles dispersed in the fluid, wherein the fluid is silicone oil, and wherein each of the plurality of hard particles is a silica particle.

2. An electronic apparatus, comprising:

an adhesive that includes a flexible adhesive material, and a plurality of particles dispersed in the adhesive material, the plurality of particles being deformed under a low-rate load and not being deformed under a high-rate load, wherein the adhesive material and the plurality of particles are deformed under the low-rate load, wherein, under the high-rate load, the adhesive material is deformed, and particles of the plurality of particles are situated close to one another without being deformed, wherein each of the plurality of particles includes a flexible outer shell, fluid contained in the outer shell, and a plurality of hard particles dispersed in the fluid, wherein the fluid is silicone oil, and wherein each of the plurality of hard particles is a silica particle; and an electronic component bonded with the adhesive.

3. An optical apparatus, comprising:

an adhesive that includes a flexible adhesive material, and a plurality of particles dispersed in the adhesive material, the plurality of particles being deformed under a low-rate load and not being deformed under a high-rate load, wherein the adhesive material and the plurality of particles are deformed under the low-rate load, wherein, under the high-rate load, the adhesive material is deformed, and particles of the plurality of particles are situated close to one another without being deformed, wherein each of the plurality of particles includes a flexible outer shell, fluid contained in the outer shell, and a plurality of hard particles dispersed in the fluid, wherein the fluid is silicone oil, and wherein each of the plurality of hard particles is a silica particle; and an optical component bonded with the adhesive.

4. The adhesive of claim 1, wherein the plurality of particles are dilatant particles.

5. The adhesive of claim 1, wherein the low-rate load has a loading rate of 9.8 m/s$^2$ or less.

6. The adhesive of claim 5, wherein the high-rate load has a loading rate of 49 m/s$^2$ or more.

7. The adhesive of claim 1, wherein the outer shell has a Young's modulus of 100 MPa or less.

8. The adhesive of claim 1, wherein the fluid contained in the outer shell has a kinetic velocity of not less than 10 mm$^2$/s and not greater than 150 mm$^2$/s at 25° C.

9. The adhesive of claim 1, wherein the fluid contained in the outer shell has a kinetic velocity of not less than 30 mm$^2$/s and not greater than 100 mm$^2$/s at 25° C.

10. The adhesive of claim 1, wherein a diameter of the hard particles is not less than 1nm and not greater than 30 μm.

11. The adhesive of claim 1, wherein a diameter of the hard particles is not less than 500 nm and not greater than 2.5 μm.

12. The adhesive of claim 1, wherein the silicone oil is present in an amount that is not less than 22 parts by mass and not greater than 60 parts by mass with respect to 100 parts by mass of silica particles.

* * * * *